United States Patent
Absher et al.

(10) Patent No.: US 11,181,553 B2
(45) Date of Patent: Nov. 23, 2021

(54) RECOMMENDING MEASUREMENTS BASED ON DETECTED WAVEFORM TYPE

(71) Applicant: TEKTRONIX, INC., Beaverton, OR (US)

(72) Inventors: Ian R. Absher, Portland, OR (US); Kraig M. Strong, Portland, OR (US)

(73) Assignee: TEKTRONIX, INC., Beaverton, OR (US)

(*) Notice: Subject to any disclaimer, the term of this patent is extended or adjusted under 35 U.S.C. 154(b) by 0 days.

(21) Appl. No.: 16/811,753

(22) Filed: Mar. 6, 2020

(65) Prior Publication Data

US 2020/0209282 A1 Jul. 2, 2020

Related U.S. Application Data

(63) Continuation of application No. 15/262,406, filed on Sep. 12, 2016, now Pat. No. 10,585,121.

(51) Int. Cl.
| | | |
|---|---|---|
| *G01R 13/22* | (2006.01) | |
| *G01R 13/02* | (2006.01) | |
| *G01R 23/16* | (2006.01) | |
| *G06N 20/20* | (2019.01) | |
| *G06N 20/00* | (2019.01) | |
| *G06N 7/00* | (2006.01) | |

(52) U.S. Cl.
CPC ............ *G01R 13/22* (2013.01); *G01R 13/02* (2013.01); *G01R 23/16* (2013.01); *G06N 7/005* (2013.01); *G06N 20/00* (2019.01); *G06N 20/20* (2019.01)

(58) Field of Classification Search
CPC ....... G01R 13/22; G01R 23/16; G06N 99/005
See application file for complete search history.

(56) References Cited

U.S. PATENT DOCUMENTS

| | | | | |
|---|---|---|---|---|
| 6,571,185 B1* | 5/2003 | Gauland | ................ | G01R 13/02 |
| | | | | 702/68 |
| 2005/0131688 A1* | 6/2005 | Goronzy | ................ | G10L 15/26 |
| | | | | 704/240 |

(Continued)

FOREIGN PATENT DOCUMENTS

| | | |
|---|---|---|
| JP | 2000-314750 | 11/2000 |
| JP | 2002-162419 | 6/2002 |

*Primary Examiner* — Manuel L Barbee
(74) *Attorney, Agent, or Firm* — Miller Nash LLP; Andrew J. Harrington

(57) ABSTRACT

An oscilloscope including an input port for receiving training data including waveforms and corresponding known classifications and a processor for training a plurality of classifiers on the training data. Training includes iteratively applying each classifier to each waveform of the training data to obtain corresponding predicted waveform classifications and comparing the predicted waveform classifications with the known classifications. Classifiers are corrected when predicted waveform classifications does not match the known classifications. Models for each classification are constructed with suggested measurements or actions. Subsequently, live waveform data is captured by the oscilloscope and the classifiers are applied to the live data. When a confidence value for a single classification exceeds a threshold, the waveform data is classified, and suggested measurements or actions are implemented in the oscilloscope based on the classification.

20 Claims, 6 Drawing Sheets

(56) References Cited

U.S. PATENT DOCUMENTS

| | | |
|---|---|---|
| 2009/0028198 A1 | 1/2009 | Belenkii |
| 2016/0012521 A1 | 1/2016 | Carlucci |
| 2016/0125218 A1* | 5/2016 | Deppieri ................ G06K 9/183 235/454 |
| 2016/0341766 A1* | 11/2016 | Deverson ............. G01R 13/029 |

* cited by examiner

RECOMMENDING MEASUREMENTS BASED ON DETECTED WAVEFORM TYPE

FIELD OF THE INVENTION

This disclosure is directed to a system and methods for oscilloscope operation, and, more particularly, to a system and methods for detecting input waveform types and suggesting corresponding measurement settings for the oscilloscope.

BACKGROUND

Test and measurement systems are designed to receive signal inputs, sample the signals, and display the result as a waveform. Various settings can be employed to control the manner of sampling, the nature of the samples taken, and the manner in which the waveform is displayed. Some advanced test and measurement systems include large numbers of potential control settings, and many such settings are only useful for specific input types. Accordingly, advanced models can inundate the user with choices, while making relevant settings exceedingly difficult to find.

Various approaches have been employed to combat the usability problems inherent with a complex control interface. For example, commonly-used measurements can be placed at the top of the display for easier access. However, this approach is not context sensitive, and a commonly used measurement for some users may not be commonly-used for other users. Another approach involves automatically adding potential measurements to the display screen, but such approaches are not tailored to the received waveform and may contain overly general or irrelevant information. Yet another approach allows a user to select a snapshot window of a measured waveform and all measurements related to the window are displayed including both relevant and irrelevant data. Such an approach still requires a user to sift through irrelevant information to find useful measurement options for an incoming waveform.

Embodiments of the invention address these and other issues.

SUMMARY OF THE DISCLOSURE

Embodiments of the disclosed subject matter include an oscilloscope configured to employ machine learning to classify incoming waveforms and/or attached buses and suggest measurements or other actions based on the classification. The oscilloscope undergoes a learning phase, where a plurality of classifiers receive training data representing particular waveforms or buses along with known classifications. The classifiers are applied to the training data and corrected when classifications output by the classifiers are incorrect in light of the known classifications. Confidence thresholds can also be stored for each classifier. Corresponding models are generated for each classifier, and suggested measurements and/or actions are added to each model. Further, feature selection may be employed on each classifier to reduce a set of classifier inputs by removing inputs that are not useful for the corresponding classification. Cross validation may also be employed to increase the accuracy of the classifiers. Such machine learning may occur for each manufactured oscilloscope or may occur for a master oscilloscope, with the results loaded into a plurality of oscilloscope at the point of manufacture. At runtime, the oscilloscope receives incoming waveforms and applies each classifier to the incoming waveform. Each classifier returns a confidence value for a corresponding classification. If a single classifier returns a confidence value in excess of the classifier's confidence threshold, then the waveform has been properly classified. The classification is forwarded to a recommender, which obtains the model associated with the classification and implements any suggested measurements or actions.

Accordingly, in at least some aspects a test and measurement instrument includes an input port configured to receive measurement data, and a processor coupled to the input port. The processor is configured to apply a plurality of classifiers to the measurement data to determine a classification for the measurement data. The processor also selects a model corresponding to the classification, where the model corresponds to suggested measurements. Further, the processor configures the test and measurement instrument to employ the suggested measurements corresponding to the selected model when capturing a waveform received over the input port.

In another aspect, a method is disclosed for training a test and measurement instrument to suggest measurements. The method includes receiving training data including waveforms and corresponding known classifications via an input port. A plurality of classifiers are trained, via the processor, on the training data by iteratively applying each classifier to each waveform of the training data to obtain corresponding predicted waveform classifications. Training further includes comparing the predicted waveform classifications with the known classifications, and correcting each classifier that outputs a predicted waveform classification that does not match the known classification for the corresponding waveform.

These and other aspects are discussed in more detail herein below.

DETAILED DESCRIPTION

Figure 1:
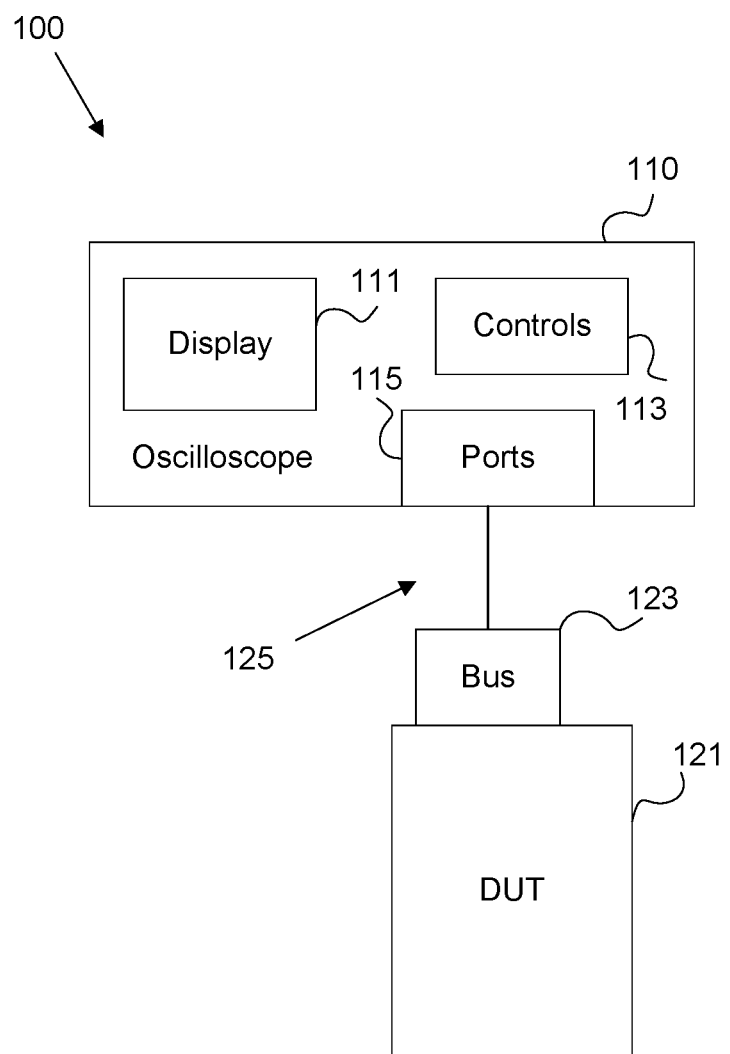
FIG. 1 is a block diagram of an embodiment of a test system including an oscilloscope configured to accept a plurality of input signals from a device under test (DUT).

The aspects of the present disclosure are susceptible to various modifications and alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific embodiments described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

FIG. 1 is a block diagram of an embodiment of a test system 100 including an oscilloscope 110 configured to accept one or more input signals as measurement data 125, for example to test the signals from a device under test (DUT) 121. DUT 121 may be any signal source configured to communicate via electrical and/or optical signals. For example, DUT 121 may include any form of transmitter or a signal transmission medium coupled via one or more signal probes. DUT 121 may transmit a wide variety of waveforms as input signals that can be measured by the oscilloscope 110 as measurement data 125, which is discussed more fully below. For example, the waveforms may be transmitted in the form of sine waves, square waves, pulse width modulation signals, rising edge signals, falling edge signals, ramp signals, direct current (DC) signals, noise signals, sin(x)/x signals where x is a variable value, Gaussian signals, Lorentz signals, exponential rise signals, exponential decay signals, Haversine signals, cardiac signals, etc. The DUT 121 may optionally connect to the oscilloscope 110 via a bus 123. A bus 123 is any communication system that transfers signals or data between two points. Many types of buses 123 employ specific communication protocols. For example, bus 123 may be configured as a parallel bus, a Serial Peripheral Interface (SPI) bus, an Inter-Integrated Circuit (I2C) bus, a Universal Serial Bus (USB), a Local Interconnect Network (LIN) bus, a Controller Area Network (CAN) bus, an audio bus, an Aeronautical Radio Inc. data transfer standard 429 (ARINC429) bus, a Radio Sector standard 232 (RS232) bus, an Ethernet bus, a FlexRay bus, etc. The DUT 121 may be employed to train the oscilloscope 110 to classify the waveforms/buses in some aspects. In other aspects, the DUT 121 may be a device to be tested by the oscilloscope.

The oscilloscope 110 is a test and measurement instrument configured to receive the measurement data 125, classify the measurement data 125 to determine which type of waveform is being received or which type of bus 123 is connected to the oscilloscope, suggest measurements or actions to be taken based on the classification, and ultimately display relevant data on display 111 including one or more graticules. The oscilloscope 110 includes ports 115 for receiving the measurement data 125 and forwarding the signals/data to local hardware for conditioning, sampling, classification, etc. The oscilloscope 110 also includes controls 113 for receiving user input, for example alternating current (AC) or DC coupling controls, trigger level controls, trigger-level hysteresis controls to alter trigger-level hysteresis thresholds and margins, user selections, user over-rides, etc. By employing the controls 103, a user can train or employ the oscilloscope to classify waveforms or buses and accept or reject suggested measurements or actions presented on the display 111 as a result of such classifications. It should be noted that oscilloscope 100 is presented as an example for purposes of clarity of discussion, but should not be considered limiting as multiple types of oscilloscopes, test and measurements systems, and other test setups may be employed without departing from the present disclosure.

Figure 2:
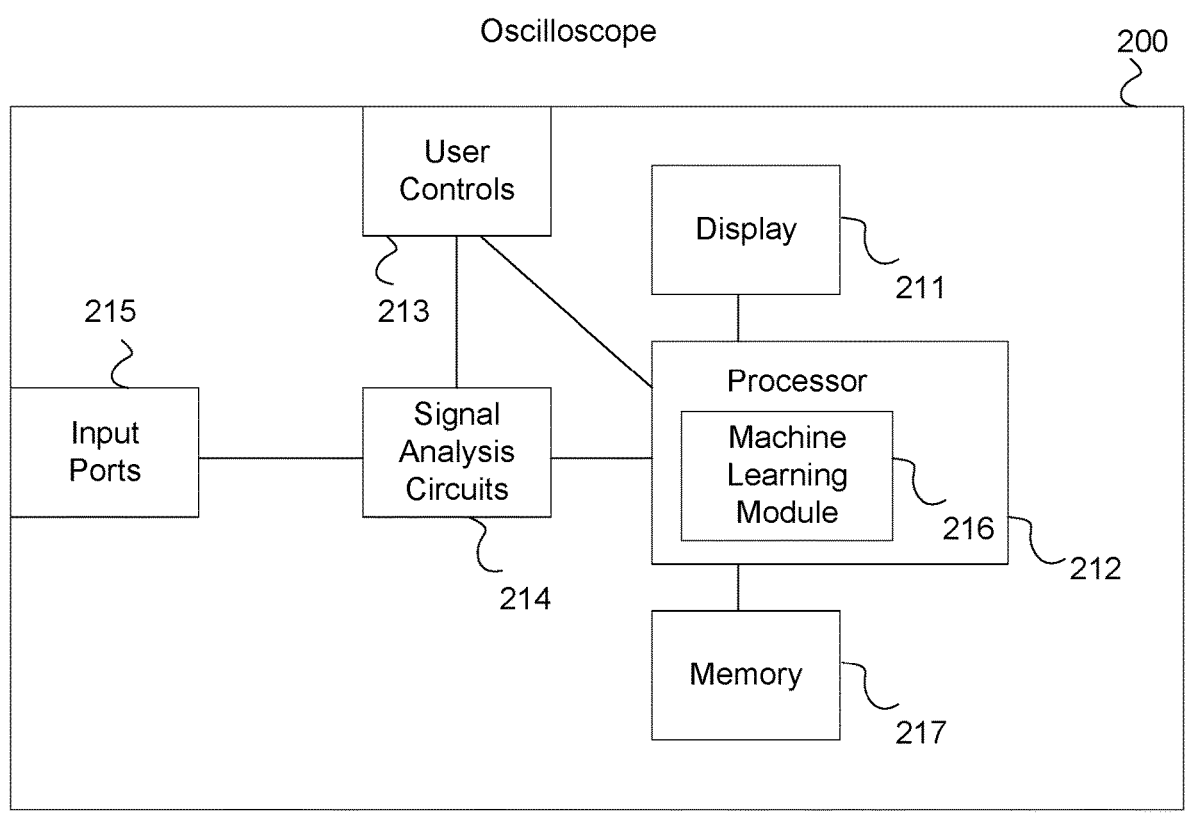
FIG. 2 is a block diagram of an embodiment of an oscilloscope.

FIG. 2 is a block diagram of an embodiment of an oscilloscope 200, which may be employed in a test system such as test system 100. For example, oscilloscope 200 may be substantially similar to oscilloscope 100 and connected to a DUT or other training device in similar fashion. Oscilloscope 200 may be employed to implement test and measurement system 300, store and interact with machine learning objects 400, and/or implement methods 500, 600, and/or any other method disclosed herein as shown in FIGS. 1-6, respectively. Oscilloscope 200 includes input ports 215 which may be substantially similar to port 115 and may include any electrical and/or optical ports, receivers, etc. configured to accept an input signal including measurement or training data. Input ports 215 may include channel inputs, phase reference inputs, clock inputs, and/or any other signal input. Signal input ports 215 are coupled to signal analysis circuits 214, which may include conditioning circuits, amplifiers, samplers, analog to digital converters, phase reference circuits, clock circuits, and/or any components employable to obtain measurement or training data from the input signal received via the input ports 215. Signal analysis circuits 214 receive input signals from the signal input ports 215, condition the signals, perform signal sampling, and/or digitize the signals and forward the results to memory 217 or processor 212 for analysis. Signal analysis circuits 214 may be implemented as an application specific integrated circuit (ASIC), a digital signal processor (DSP), or other processing circuitry. Signal analysis circuits 214 are coupled to processor 212, which may be implemented as a general purpose processor. Processor 212 is configured to execute instructions from memory 217 and perform any methods and/or associated steps indicated by the instructions. Memory 217 may be implemented as processor cache, random access memory (RAM), read only memory (ROM), solid state memory, hard disk drive(s), or any other memory type. Memory 217 acts as a non-transitory medium for storing computer program products and other instructions, storing waveform samples, and/or storing other data objects such as classifiers and models as discussed below. Memory 217 provides such stored information to the processor 212 for computation as needed.

Processor 212 may include a machine learning module 216. The machine learning module 216 is a processing circuit and/or set of executing instructions configured to operate machine learning algorithms, such as machine learning module 333. For example, the processor 212 and machine learning module 216 may be employed during a learning phase to train data objects such as classifiers 335 and 435, and models 336 and 436. Such training may employ training data such as training data 331. The machine learning module 216 is also configured to operate machine learning algorithms and a recommender, such as recommender 338, during an evaluation and/or action phase. As such, machine learning module 216 is configured to perform methods 500, 600, and/or any other methods discussed herein. In some aspects, the machine learning module 216 may also be implemented, in part, in the memory 217 and/or other components in oscilloscope 200.

User controls 213 are coupled at least to the processor 212 and signal analysis circuits 214. User controls 213 may include strobe inputs, gain controls, triggers, display adjustments, power controls, or any other controls employable by a user to display an input signal on display 211. User controls 213 may also allow the user to select particular measurements or actions to be taken when analyzing a signal. Accordingly, the machine learning module 216 may suggest measurements and/or actions via the display 211, and the user controls 213 may be configured to allow the user to accept or override the suggested actions or measurements. In some aspects, the user controls 213 are integrated, in whole or in part, in the display 211. Display 211 may be a digital screen or a cathode ray tube based display. Display 211 includes a plurality of graticules for displaying corresponding input signals, for example as eye diagrams, histograms, heat maps, time domain signals, frequency domain signals, etc. Accordingly, oscilloscope 200 may be configured to employ the machine learning module 216 to train classifiers and modules to classify training data to determine classifications for incoming waveforms and/or buses as discussed below. The oscilloscope 200 may also be configured to employ the classifiers and modules to classify measurement data and suggest measurements and/or actions as discussed below. Further, the oscilloscope 200 may take action, as directed by the suggested measurements and/or suggested actions, without requiring direct user initiation or approval.

Figure 3:
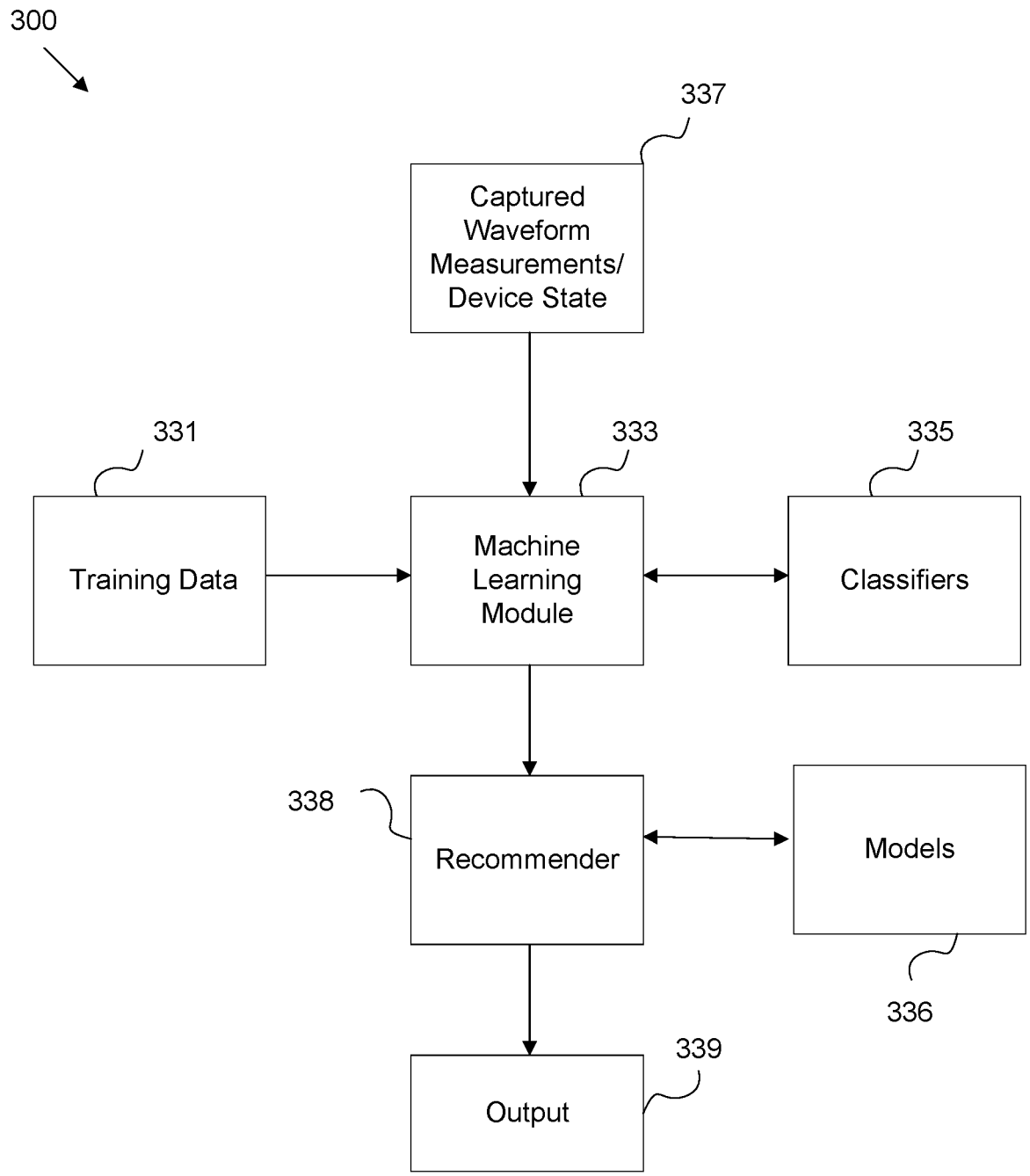
FIG. 3 is a block diagram of an embodiment of a test and measurement system configured to employ machine learning to classify waveforms and suggest corresponding measurements and actions.

FIG. 3 is a block diagram of an embodiment of a test and measurement system 300 configured to employ machine learning to classify waveforms and suggest corresponding measurements and actions. Test and measurement system 300 may be implemented in an oscilloscope, such as oscilloscope 100 and/or 200, configured to receive signals from a DUT, such as DUT 121 or other training hardware. Test and measurement system 300 includes a machine learning module 333, classifiers 335, recommender 338, and models 336, which can be implemented by a general purpose processor, application specific processor, memory, or combinations thereof (e.g. processor 212, machine learning module 216, and memory 217). The test and measurement system 300 accepts training data 331 and captured waveform measurements/device states 337 as inputs and generates output 339 as described below.

Machine learning module 333 (e.g. machine learning algorithm) is a set of instructions configured to perform a task, measure the performance of the task, and alter the performance of the task based on the measurements to improve performance based on experience. Machine learning module 333 may be implemented according to a supervised learning algorithm including analytical learning, artificial neural network, backpropagation, boosting, Bayesian statistics, case-based reasoning, decision tree learning, inductive logic programming, Gaussian process regression, group method of data handling, kernel estimators, learning automata, minimum message length (decision trees, decision graphs, etc.), multilinear subspace learning, naive Bayes classifier, maximum entropy classifier, conditional random field, nearest neighbor algorithm, Probably Approximately Correct (PAC) learning, ripple down rules, symbolic machine learning, sub-symbolic machine learning, support vector machines, Minimum Complexity Machines (MCM), random forests, ensembles of classifiers, ordinal classification, data pre-processing, handling imbalanced datasets, statistical relational learning, and/or Proaftn. For purposes of clarity, machine learning module 333 is discussed in terms of random forests, referred to herein as decision forests, but multiple combinations of supervised learning algorithms may be employed. Further, deep learning algorithms may also be employed as part of machine learning module 333.

During a learning phase, machine learning module 333 receives training data 331. Training data 331 is a set of waveforms and corresponding known classifications. Machine learning module 333 creates and trains a plurality of classifiers 335 to classify the training data 331. A classifier 335 is any component configured to provide a classification of incoming data based on preconfigured rules, and modify such rules through training. For example, a classifier 335 may include a random decision forest with multiple decision trees. Each classifier 335 corresponds to a particular classification, such as sine wave, square wave, pulse width modulation, rising edge, falling edge, ramp, DC, noise, sin(x)/x, Gaussian, Lorentz, exponential rise, exponential decay, Haversine, cardiac, parallel bus, SPI bus, I2C bus, USB, LIN bus, CAN bus, audio bus, ARINC429 bus, RS232 bus, Ethernet bus, FlexRay bus, etc. Machine learning module 333 applies each set of waveforms in the training data 331 to each classifier 335, and each classifier 335 returns a result. For example, when training data 331 consistent with a sine wave is forwarded to each classifier 335, a sine wave classifier 335 should return a match and all other classifiers should not return a match. The machine learning module 333 then employs the known classification to correct the rules of any classifier returning an incorrect result. For example, when a USB classifier 335 returns a match when a Gaussian waveform is applied (e.g. an incorrect match), the machine learning module 333 corrects the rules of the USB classifier 335.

Classifiers 335 may employ various signal qualities to classify training data 331 and measurement data (e.g. captured waveform measurements/device states 337). For example, classifiers 335 may employ signal amplitude characteristics such as amplitude, maximum amplitude, minimum amplitude, peak-to-peak, positive overshoot, negative overshoot, mean amplitude, signal Root Mean Square (RMS), AC RMS, DC common mode, AC common mode (e.g. peak-to-peak), signal area, differential Crossover, signal top, signal base, bit high, bit low, bit amplitude, transmission/network transmission (T/nT) ratio, etc. Classifiers 335 may also employ time related characteristics such as period, frequency, data rate, positive pulse width, negative pulse width, skew, rise time, fall time, delay, rising slew rate, falling slew rate, phase, positive duty cycle, negative duty cycle, burst width, setup time, hold time, time outside level, high time, low time, duration of N-periods where N is a variable number of periods, Spread Spectrum Clocking (SSC) frequency deviation, SSC modulation rate, positive edge count, negative edge count, pulse count, burst, etc. Classifiers 335 may also employ jitter related characteristics such as Time Interval Error (TIE), phase noise, random jitter (RJ), RJ anti-aliasing (RJ-aa), non-periodic jitter (NPJ), total jitter at specified bit error rate (TJ@BER), deterministic jitter (DJ), DJ anti-aliasing (DJ-aa), periodic jitter (PJ), data-dependent jitter (DDJ), duty cycle distortion (DCD), interval that includes all but $10^{-2}$ jitter distribution (J2), interval that includes all but $10^{-9}$ jitter distribution (J9), sub-rate jitter (SRJ), frequency (F)/2, F/4, F/8, etc. Classifiers 335 may also employ power related characteristics such as power quality power derivative, modulation, power harmonics, switching loss, ripple, etc. Accordingly, the classifiers 335 are configured to determine a classification for the training data and measurement data by examining signal amplitude, time characteristics, jitter, and/or power. The training data 331 may be delivered to the classifiers 335 in various forms, including raw point data, waveform images, vertical histograms, device settings or information (e.g. device state), a collection of multiple acquisitions combined into a heat map, waveform measurements, etc. As a wide variety of training data and classifications types may be employed by classifiers 335, a plurality of classifiers 335 may employ a plurality of machine learning algorithms, with specified machine learning algorithms selected to classify particular waveform types. In other words, some machine learning algorithms may be better suited to classify a first set waveforms, which other machine learning algorithms may be better suited to classify a second set of waveforms. Thus some classifiers 335 may employ different machine learning algorithms than other classifiers 335 in the same system.

A model 336 is built (e.g. by the machine learning module 333) during the learning phase to correspond with each classifier 335 (and hence each classification). Some models 336 are built to correspond with waveforms incoming over an input port (e.g. ports 115/215), while others correspond with a bus (e.g. bus 123) connected to the input port. Hence, measurements that are highly determinative for some classifications may not be useful for other classifications. Accordingly, feature selection is employed by the machine learning module 333 to remove unneeded measurements from each classifier 335 and generate a corresponding model 336 with only relevant data. Accordingly, each model 336 describes the measurements the corresponding classifier 335 can accept as input. Further, each model 336 can be configured to include particular measurements or actions user may want to take in the event that incoming data indicates a corresponding classification.

Upon completely processing the training data 331, the machine learning module 333 has created and trained the classifiers 335 and models 336. The state of the machine learning module 333 has created and trained the classifiers 335 and models 336 may be stored in memory for run time use by an oscilloscope. For example, a master test and measurement instrument may train the machine learning module 333, classifiers 335, and models 336 and store the results in a memory readable format to be loaded on multiple oscilloscopes, when such oscilloscopes are manufactured. In another aspect, each oscilloscope can be trained during the manufacture process.

An end user employs the test and measurement system 300 at run time as part of an evaluation phase. During the evaluation phase, captured waveform measurements/device states 337 are received by the machine learning module 333, for example via an input port/signal analysis circuit in the case of a waveform or via the signal analysis circuits and/or memory in the case of a device state. Each classifier 335 is applied to the measurements/states 337. The classifiers 335 each indicate a match or lack of match. In some aspects, the classifiers 335 also return a confidence value. The measurements/states 337 received during the evaluation phase may contain virtually any type of data, and the classifications are unknown. Accordingly, a classification is determined if only one classifier 335 returns a match. If no classifiers 335 return a match, or if multiple classifiers 335 return a match, then the system 300 is unable to classify the incoming signal. In the event the measurements/states 337 are matched to a single classifier 335, the classification (e.g. waveform or bus type) is forwarded to the recommender 339.

The recommender 339 is a component configured to recommend particular actions or measurements to a user. The recommender 338 receives the classification and obtains the corresponding model 336. Based on the model 336 returned, the recommender 338 can recommend particular measurements that a user may find useful for the classifications, such as useful trigger points, particular transforms, etc. that are relevant to the classified waveform or bus. Further, the recommender 338 can recommend particular actions that a user may wish to take based on the classification, such as selecting configuring a bus, changing display ranges, etc. In addition, the recommender 338 may also reorder lists of suggested actions/measurements so the most relevant actions/measurements for the particular classification are listed first. Also, the recommender 338 may grey out or remove actions/measurements that are unsuited for a particular classification. The recommender 338 then sends such suggestions to the user via an output 339, which may include a display such as display 111/211. The user may the employ the controls (e.g. controls 113/213) to accept or reject the suggestions. In some aspects, the recommender 338 may also take any suggested action or initiate any suggested measurements immediately without requiring direct user initiation, approval, or interaction.

Figure 4:
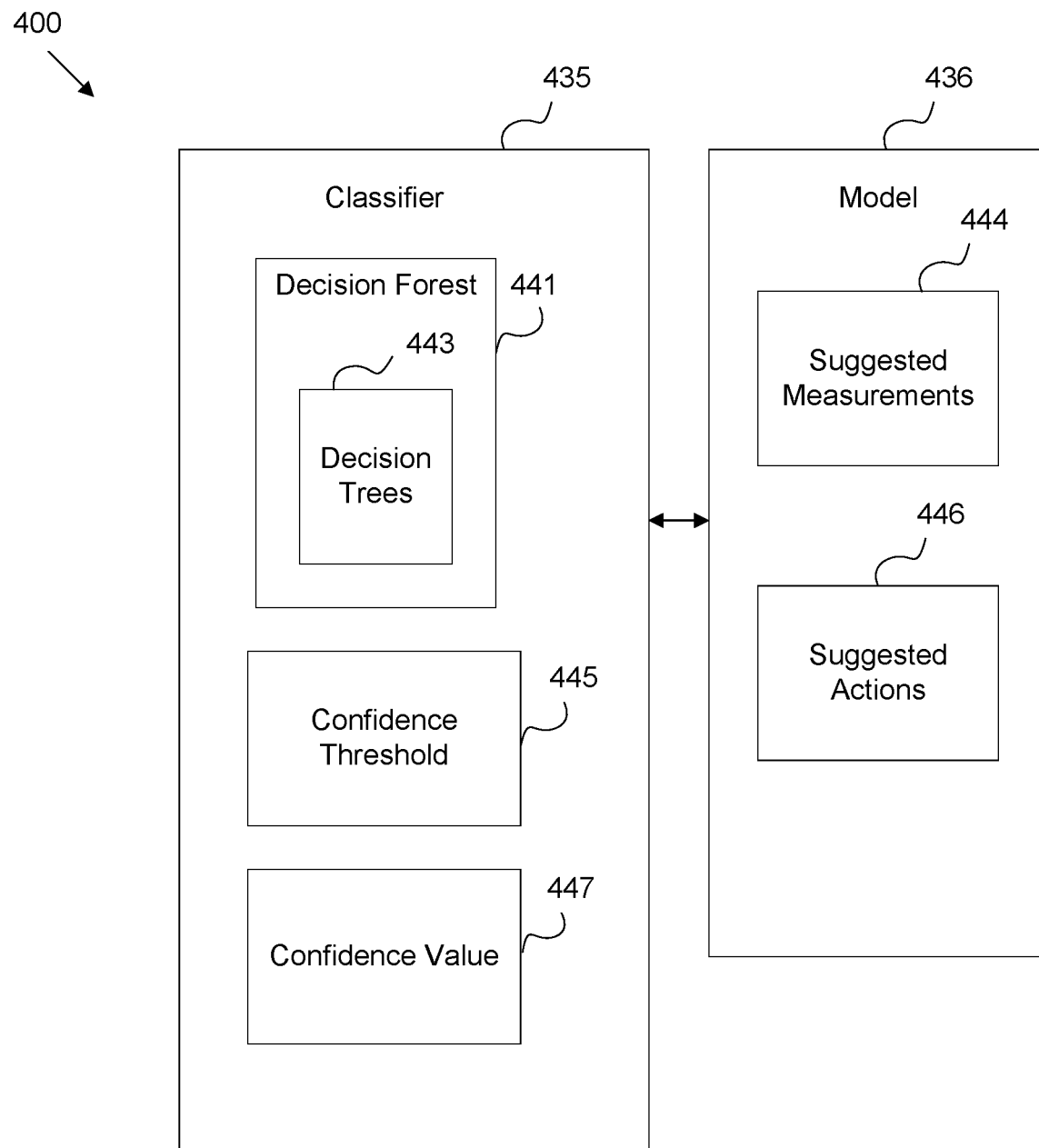
FIG. 4 is a block diagram illustrating an embodiment of machine learning objects including classifier and model data objects.

FIG. 4 is a block diagram illustrating an embodiment of machine learning objects 400 including classifier 435 and model data 436 objects. Classifier 435 and model 436 are substantially similar to classifiers 335 and models 336, respectively. Classifier 435 is an example of a classifier 335 configured to implement a random forest machine learning algorithm. Classifier 435 includes a decision forest 441, which further includes a plurality of decision trees 443. Specifically, a decision forest 441 is created for each classification (e.g. as discussed with respect to classifier 335). During training, decision trees 443 are grown in the decision forest 441 based on the training data. Various signal qualities are employed by the decision trees 443 to classify the training data, as discussed above, and the decision trees 443 are corrected when an incorrect result is returned (e.g. improper match or improper lack of match). In some aspects, one hundred decision trees 443 are employed in a decision forest 441. Randomization is employed to reduce the occurrence of overfitting of the decision trees 443 to the training data set. Upon completion of the learning phase, a confidence threshold 445 may be stored to each classifier 435. A confidence threshold 445 indicates a minimum percentage of decision trees 443 in the decision forest 441 that should output a positive classification (e.g. return a match) to result in a positive classification for the corresponding decision forest 441 and corresponding classifier 435. For example, a confidence threshold 445 of eighty percent may be used to indicate that eighty percent of the decision trees 443 should indicate a match before the system is confident that a match has actually been found. Further, cross-validation may be employed to evaluate the accuracy of the decision forest 441 with respect to the training data set. The cross-validation results may be employed to further correct the output of the decision forest relative to the training data.

During the evaluation phase, measurement data is received via an input port and forwarded to the processor. The processor applies each of the classifiers 435 to the measurement data to determine a classification for the measurement data. When a selected classifier 435 is applied, the decision forest 443 applies each decision tree 443 and receives an output. The classifier 435 employs the percentage of decision tree 443 outputs that report a match as a confidence value 447. When the confidence value 447 output by the decision forest 441 exceeds a confidence threshold 445 of the classifier 435, the decision tree 441 and hence the classifier 435 is considered to have returned a match.

As shown, each classifier 435 corresponds with a model 436 that indicates suggested measurements 444 and suggested actions 446 associated with the classification of the classifier 435. When a classifier 435 returns a match, as indicated by a confidence value 447 in excess of the confidence threshold 445, the recommender selects the model 436 corresponding to the classification to obtain the corresponding suggested measurements 444 and/or suggested actions 446. The recommender can then configure the test and measurement instrument to employ the suggested measurements 444 and/or suggested actions 446 corresponding to the selected model 436 when capturing a waveform received over the input port. As noted above, suggested measurements 444 and/or suggested actions 446 are set during the learning phase to suggest intuitive actions for the user. Suggested measurements 444 may include sorting, enabling, highlighting, and/or hiding any of the measurements listed with respect to classifier 335 on the display. Suggested actions 446 may include sorting, enabling, highlighting, and/or hiding any of the bus categories listed with respect to classifier 335 on the display.

Figure 5:
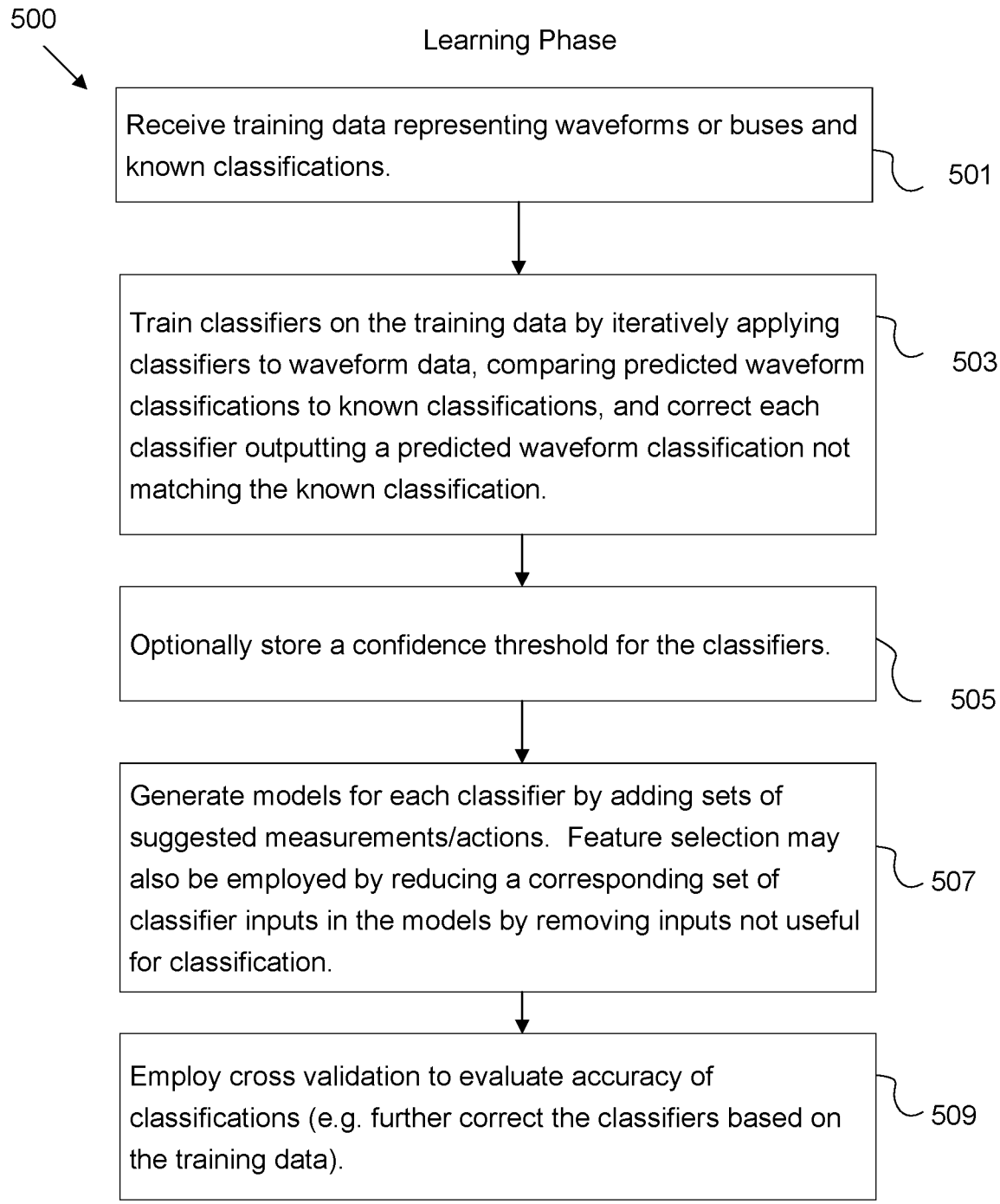
FIG. 5 is a block diagram illustrating an embodiment of a method of implementing a learning phase in a test and measurement system.

FIG. 5 is a block diagram illustrating an embodiment of a method 500 of implementing a learning phase in a test and measurement system. Method 500 may be employed by an oscilloscope, such as oscilloscope 100/200 operating a test and measurement system, such as system 300 with data structures such as machine learning objects 400. At block 501, training data, such as training data 331, is received, for example via an input port. The training data represents waveforms and/or buses and may also include corresponding known classifications. At block 503, a processor employs a machine learning algorithm to train the classifiers on the training data based on the known classifications. Specifically, each classifier is iteratively applied to each waveform of the training data to obtain corresponding predicted waveform classifications. The predicted waveform classifications are compared with the known classifications. Further, each classifier that outputs a predicted waveform classification that does not match the known classification for the corresponding waveform is corrected. By iteratively testing and correcting each classifier, the classifiers progressively become more accurate when attempting classification of new input data. At block 505, confidence thresholds may optionally be stored for the classifiers. For example, decision forest based classifiers may employ confidence thresholds, while other learning algorithms may not employ confidence thresholds and may instead return only a match (e.g. a classification) or a lack of a match (no classification) for each classifier. Models, such as models 436, are generated at block 507. Sets of suggested measurements and/or suggested actions are added to each model. The suggested measurements/actions include instructions executed by the test and measurement system upon matching measurement data with a classification of a classifier corresponding to the model. For example, suggested measurements associated with waveform classification are stored to a classifier corresponding to waveform classification, and suggested actions associated with bus classification are stored to a classifier corresponding to bus classification. At block 509, cross validation of the training data is employed to evaluate the accuracy of and/or further correct the classifiers. Cross validation may be performed on both waveform based training data and bus based training data.

Figure 6:
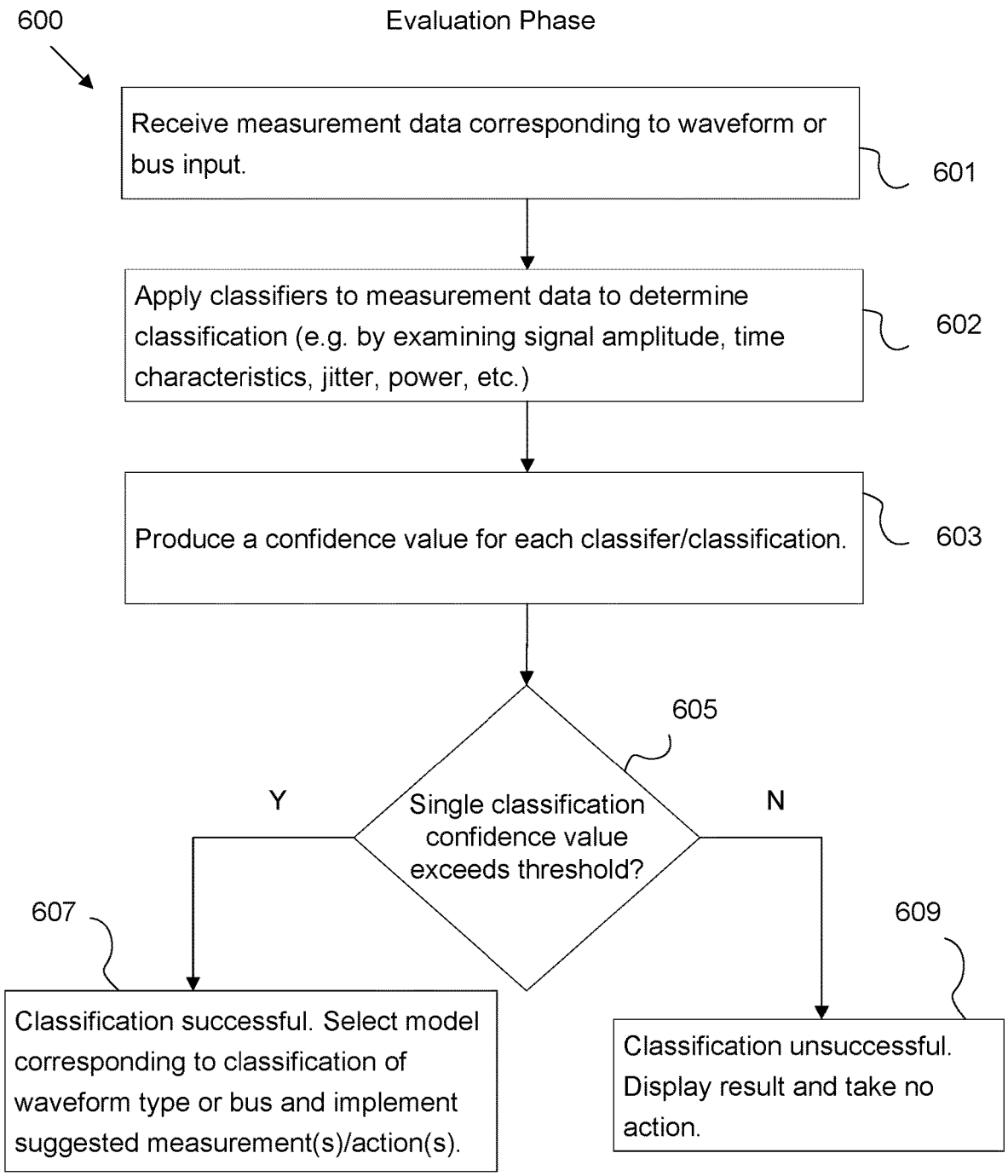
FIG. 6 is a block diagram illustrating an embodiment of a method of implementing an evaluation phase in a test and measurement system.

FIG. 6 is a block diagram illustrating an embodiment of a method 600 of implementing an evaluation phase in a test and measurement system. Method 600 may be employed by an oscilloscope, such as oscilloscope 100/200 operating a test and measurement system, such as system 300 with data structures such as machine learning objects 400. Specifically, method 600 may be employed after the training of method 500 is completed. At block 601, measurement data is received, for example via an input port. The received measurement data corresponds to a measured waveform or bus input, and is received for purposes of classification. At block 602, each of the classifiers are applied to the measurement data to determine a classification, for example for a measured waveform or bus input. The classifiers each return a classification by examining signal amplitude, time characteristics, jitter, power, etc. as described above. At block 603, a confidence value is produced for some or all of the classifiers to support determination of a classification. At block 605, the confidence values of the classifiers are compared to their respective confidence thresholds to determine whether a single classifier produces a confidence value in excess of a corresponding stored confidence threshold. If two classifiers return a match, then classification is unclear. If no classifier returns a match, then classification is not possible. In either case, the method 600 proceed to block 609. In such a case, classification is unsuccessful. The result may be displayed on the test and measurement system display and no action is taken. If a single classifier returns a confidence value in excess of a corresponding confidence threshold, then classification of a waveform type or bus type is successful and the method 600 proceeds to block 607. A model corresponding to the classifier returning the determined classification is selected, for example by the recommender. As noted above the model corresponds to suggested measurements and/or actions for the classifier. The recommender implements the suggested measurements and/or actions by configuring the test and measurement instrument to employ the suggested measurements/actions corresponding to the selected model when capturing the measured waveform, for example upon approval by the user via controls. The recommender can either display the suggested actions/measurements to the user on the display by emphasizing or deemphasizing the suggestions, removing actions/measurements from the display that are irrelevant to the determine classification, or by preparing the test and measurement system to perform the actions upon receiving approval from the user. Feature selection may also be employed on each classifier's classification by reducing a corresponding set of classifier inputs in the models by removing inputs that are not useful for the corresponding classification. Accordingly, the oscilloscope 100/200 operating test and measurement system 300 with data objects 400 according to methods 500-600 improve the functionality of an oscilloscope by allowing the oscilloscope to classify inputs to the oscilloscope and alter the oscilloscope display accordingly to emphasize or de-emphasize device functions that are relevant to the user. Hence the devices, systems, and methods disclosed herein allow the user to access relevant functions much more easily and clearly the other systems.

Embodiments of the invention may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Although specific embodiments of the invention have been illustrated and described for purposes of illustration, it will be understood that various modifications may be made without departing from the spirit and scope of the invention. Accordingly, the invention should not be limited except as by the appended claims.

We claim:

1. A test and measurement instrument comprising:
an input port configured to receive measurement data;
a processor coupled to the input port and configured to:
apply a plurality of trained classifiers to the measurement data to determine a confidence value for each of the plurality of trained classifiers,
determine whether the confidence value for each of the plurality of trained classifiers exceeds a stored confidence threshold, and
determine a classification for the measurement data when a confidence value for a single trained classifier exceeds a stored confidence threshold,
select a single model corresponding to the classification, the selected model corresponding to a single classifier and to one or more suggested actions, and recommend the suggested actions to a user; and
a user control coupled to the processor, the user control configured to receive a selection from the user,
wherein the processor is further configured to, in response to the selection from the user, configure the test and measurement instrument to employ the suggested actions corresponding to the selected model when capturing a waveform received over the input port.

2. The test and measurement instrument of claim 1, wherein the plurality of classifiers includes at least one decision forest.

3. The test and measurement instrument of claim 1, wherein the plurality of classifiers employ a plurality of machine learning algorithms with specified machine learning algorithms selected to classify particular waveform types.

4. The test and measurement instrument of claim 1, wherein the classifiers determine a classification for the measurement data by examining signal amplitude, time characteristics, jitter, or power.

5. The test and measurement instrument of claim 1, wherein the model corresponding to the classification indicates a type of waveform incoming over the input port.

6. The test and measurement instrument of claim 1, wherein the model corresponding to the classification indicates a bus connected to the input port.

7. The test and measurement instrument of claim 1, further comprising a display, wherein the processor is further configured to recommend the suggested actions to the user by altering the display to disable actions that are not relevant to the selected model.

8. The test and measurement instrument of claim 1, wherein the processor is further configured to initiate suggested actions without direct user interaction.

9. The test and measurement instrument of claim 1, wherein each of the plurality of trained classifiers is trained during a learning phase, and wherein a trained state of the classifiers established by the learning phase is stored in a memory of the test and measurement instrument.

10. The test and measurement instrument of claim 9, wherein the learning phase is performed on a master test and measurement instrument, and the trained state is duplicated from the master test and measurement instrument and stored in a memory of the test and measurement instrument during manufacturing.

11. The test and measurement instrument of claim 1, wherein the suggested actions corresponding to the selected model are set during a learning phase, and wherein a trained state of the selected model established by the learning phase is stored in a memory of the test and measurement instrument.

12. The test and measurement instrument of claim 11, wherein the learning phase is performed on a master test and measurement instrument, and the trained state is duplicated from the master test and measurement instrument and stored in a memory of the test and measurement instrument during manufacturing.

13. The test and measurement instrument of claim 1, wherein the processor is further configured to output an alert indicating an unsuccessful classification when the confidence value for two of the plurality of trained classifiers exceeds a stored confidence threshold or when the confidence value does not exceed a stored confidence threshold for any of the plurality of trained classifiers.

14. A method of operating a test and measurement instrument, comprising:
receiving evaluation data during an evaluation operational phase of the test and measurement instrument;
applying a plurality of trainable classifiers to the evaluation data to determine a confidence value for reach of the plurality of trainable classifiers, wherein each classifier indicates whether the evaluation data matches a model corresponding to the classifier when the confidence value of the trainable classifier exceeds a stored confidence threshold;

determining a classification for the evaluation data when only one classifier indicates a match; and altering a user interface of the test and measurement instrument to recommend a suggested action to a user based on the classification.

15. The method of claim 14, wherein receiving evaluation data comprises receiving measurement data from a device under test at an input port of the test and measurement instrument.

16. The method of claim 14, wherein receiving evaluation data comprises receiving data indicating a state of the test and measurement instrument.

17. The method of claim 14, wherein each trainable classifier of the plurality of trainable classifiers operates according to a set of preconfigured rules.

18. The method of claim 17, wherein the plurality of trainable classifiers are applied to the evaluation data by a machine learning module, and wherein the machine learning module is configured to modify the rules during a training operational phase of the test and measurement instrument.

19. The method of claim 14, wherein the suggested action is associated with the model.

20. A non-transitory computer-readable medium containing instructions that, when executed by a processor in a test and measurement instrument, cause the test and measurement instrument to perform the method of claim 14.

* * * * *